(12) United States Patent
Greene et al.

(10) Patent No.: US 9,673,197 B2
(45) Date of Patent: *Jun. 6, 2017

(54) FINFET WITH CONSTRAINED SOURCE-DRAIN EPITAXIAL REGION

(71) Applicant: International Business Machines Corporation, Armonk, NY (US)

(72) Inventors: Brian J. Greene, Fishkill, NY (US); Arvind Kumar, Beacon, NY (US); Dan M. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/210,991

(22) Filed: Jul. 15, 2016

(65) Prior Publication Data

US 2016/0329428 A1 Nov. 10, 2016

Related U.S. Application Data

(60) Continuation of application No. 14/920,938, filed on Oct. 23, 2015, now Pat. No. 9,443,854, which is a
(Continued)

(51) Int. Cl.
*H01L 27/088* (2006.01)
*H01L 21/8234* (2006.01)
(Continued)

(52) U.S. Cl.
CPC .... *H01L 27/0886* (2013.01); *H01L 21/31053* (2013.01); *H01L 21/823418* (2013.01); *H01L 21/823431* (2013.01); *H01L 21/823437* (2013.01); *H01L 21/823468* (2013.01); *H01L 21/823814* (2013.01); *H01L 21/823821* (2013.01); *H01L 27/0924* (2013.01); *H01L 29/045* (2013.01); *H01L 29/0847* (2013.01); *H01L 29/161* (2013.01); *H01L 29/165* (2013.01); *H01L 29/1608* (2013.01); *H01L 29/6656* (2013.01); *H01L 29/66636* (2013.01);
(Continued)

(58) Field of Classification Search
USPC ....... 257/288, 401, 901, 57, 59, 72, 83, 257, 257/290, 351; 438/595
See application file for complete search history.

(56) References Cited

U.S. PATENT DOCUMENTS 5,879,998 A 3/1999 Krivokapic
6,806,128 B2 10/2004 Ootsuka et al.
(Continued)

OTHER PUBLICATIONS

IBM: List of IBM Patents or Patent Applications Treated as Related (Appendix P), Jul. 21, 2016, 2 pages.

*Primary Examiner* — Tram H Nguyen
(74) *Attorney, Agent, or Firm* — L. Jeffrey Kelly

(57) ABSTRACT

A method includes forming a plurality of fins on a substrate, a gate is formed over a first portion of the plurality of fins with a second portion of the plurality of fins remaining exposed. Spacers are formed on opposite sidewalls of the second portion of the plurality of fins. The second portion of the plurality fins is removed to form a trench between the spacers. An epitaxial layer is formed in the trench. The spacers on opposite sides of the epitaxial layer constrain lateral growth of the epitaxial layer.

5 Claims, 17 Drawing Sheets

Related U.S. Application Data division of application No. 14/326,745, filed on Jul. 9, 2014.

(51) Int. Cl.

| | |
|---|---|
| *H01L 29/66* | (2006.01) |
| *H01L 29/78* | (2006.01) |
| *H01L 29/165* | (2006.01) |
| *H01L 21/3105* | (2006.01) |
| *H01L 29/04* | (2006.01) |
| *H01L 21/8238* | (2006.01) |
| *H01L 27/092* | (2006.01) |
| *H01L 29/08* | (2006.01) |
| *H01L 29/16* | (2006.01) |
| *H01L 29/161* | (2006.01) |
| *H01L 21/84* | (2006.01) |

(52) U.S. Cl.
CPC ...... *H01L 29/7848* (2013.01); *H01L 29/7853* (2013.01); *H01L 21/845* (2013.01)

(56) References Cited

U.S. PATENT DOCUMENTS

| | | | |
|---|---|---|---|
| 7,226,820 B2 | 6/2007 | Zhang et al. | |
| 7,553,732 B1 | 6/2009 | Brown et al. | |
| 7,999,331 B2 | 8/2011 | Akamatsu et al. | |
| 8,324,110 B2 | 12/2012 | Cheng et al. | |
| 8,524,563 B2 | 9/2013 | Flachowsky et al. | |
| 8,581,311 B1 | 11/2013 | He | |
| 9,202,917 B2 * | 12/2015 | Ching | H01L 29/785 |
| 2007/0287255 A1 | 12/2007 | Doyle et al. | |
| 2008/0135888 A1 | 6/2008 | Lee et al. | |
| 2012/0007180 A1 | 1/2012 | Yin et al. | |
| 2013/0285141 A1* | 10/2013 | Kuo | H01L 29/66545 257/347 |
| 2014/0027860 A1 | 1/2014 | Glass et al. | |
| 2014/0117455 A1* | 5/2014 | Liu | H01L 29/66795 257/368 |
| 2014/0264489 A1* | 9/2014 | Wong | H01L 29/785 257/288 |
| 2014/0357040 A1* | 12/2014 | Loubet | H01L 29/66795 438/299 |
| 2015/0091086 A1* | 4/2015 | Lu | H01L 29/7833 257/336 |
| 2015/0137181 A1* | 5/2015 | Basker | H01L 27/0924 257/192 |
| 2015/0187571 A1* | 7/2015 | Fan | H01L 29/0653 257/401 |
| 2015/0187914 A1* | 7/2015 | Basker | H01L 29/66795 257/401 |
| 2015/0295089 A1* | 10/2015 | Huang | H01L 29/7853 257/401 |
| 2016/0013185 A1* | 1/2016 | Greene | H01L 27/0886 257/401 |
| 2016/0043082 A1 | 2/2016 | Greene et al. | |

* cited by examiner

SECTION A-A

US 9,673,197 B2

1

FINFET WITH CONSTRAINED SOURCE-DRAIN EPITAXIAL REGION

BACKGROUND

The present invention generally relates to semiconductor manufacturing and more particularly to fin field effect transistor (FinFET) devices having constrained source-drain epitaxial regions.

Complementary Metal-oxide-semiconductor (CMOS) technology is commonly used for fabricating field effect transistors (FETs) as part of advanced integrated circuits (IC), such as CPUs, memory, storage devices, and the like. Most common among these may be metal-oxide-semiconductor field effect transistors (MOSFET). In a typical MOSFET, a gate structure may be energized to create an electric field in an underlying channel region of a substrate, by which charge carriers are allowed to travel between a source region and a drain region. As ICs continue to scale downward in size, fin field effect transistors (FinFETs), sometimes referred to as tri-gate structures, may be potential candidates for the 14 nm node technology and beyond, primarily because FinFETs may offer better performance than planar FETs at the same power budget. FinFETs are three-dimensional (3D), fully depleted MOSFET devices having a plurality of fins formed from the substrate material. The gate structure may be located over the fins substantially covering the channel region, the portion of the fins not covered by the gate structure may define the source-drain regions of the device. Such architecture may allow for a more precise control of the conducting channel by the gate structure, significantly reducing the amount of current leakage when the device is in off state.

SUMMARY

According to an embodiment of the present disclosure, a method includes: forming a plurality of fins on a substrate, forming a gate over a first portion of the plurality of fins, a second portion of the plurality of fins remains exposed, forming spacers on opposite sidewalls of the second portion of the plurality of fins, removing the second portion of the plurality fins to form a trench between the spacers, and forming an epitaxial layer in the trench, lateral growth of the epitaxial layer is constrained by the spacers.

According to another embodiment of the present disclosure, a method includes: forming a plurality of fins on a substrate, conformally depositing a nitride liner above and in direct contact with the plurality of fins and the substrate, removing a top portion of the nitride liner above the plurality of fins to expose a top surface of the plurality of fins, forming a gate over a first portion of the plurality of fins, a second portion of the plurality of fins remains exposed, forming spacers on opposite sidewalls of the nitride liner on the second portion of the plurality of fins, removing the second portion of the plurality of fins to form a trench between opposing sidewalls of the nitride liner, and forming an epitaxial layer in the trench, lateral growth of the epitaxial layer is constrained by the nitride liner to form constrained source-drain regions.

According to another embodiment of the present disclosure, a structure includes: a plurality of fins on a substrate, and a gate over a first portion of the plurality of fins, a second portion of the plurality of fins not covered by the gate comprises an epitaxial layer geometrically constrained by a

2 pair of spacers located on opposite sidewalls of the second portion of the plurality of fins.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
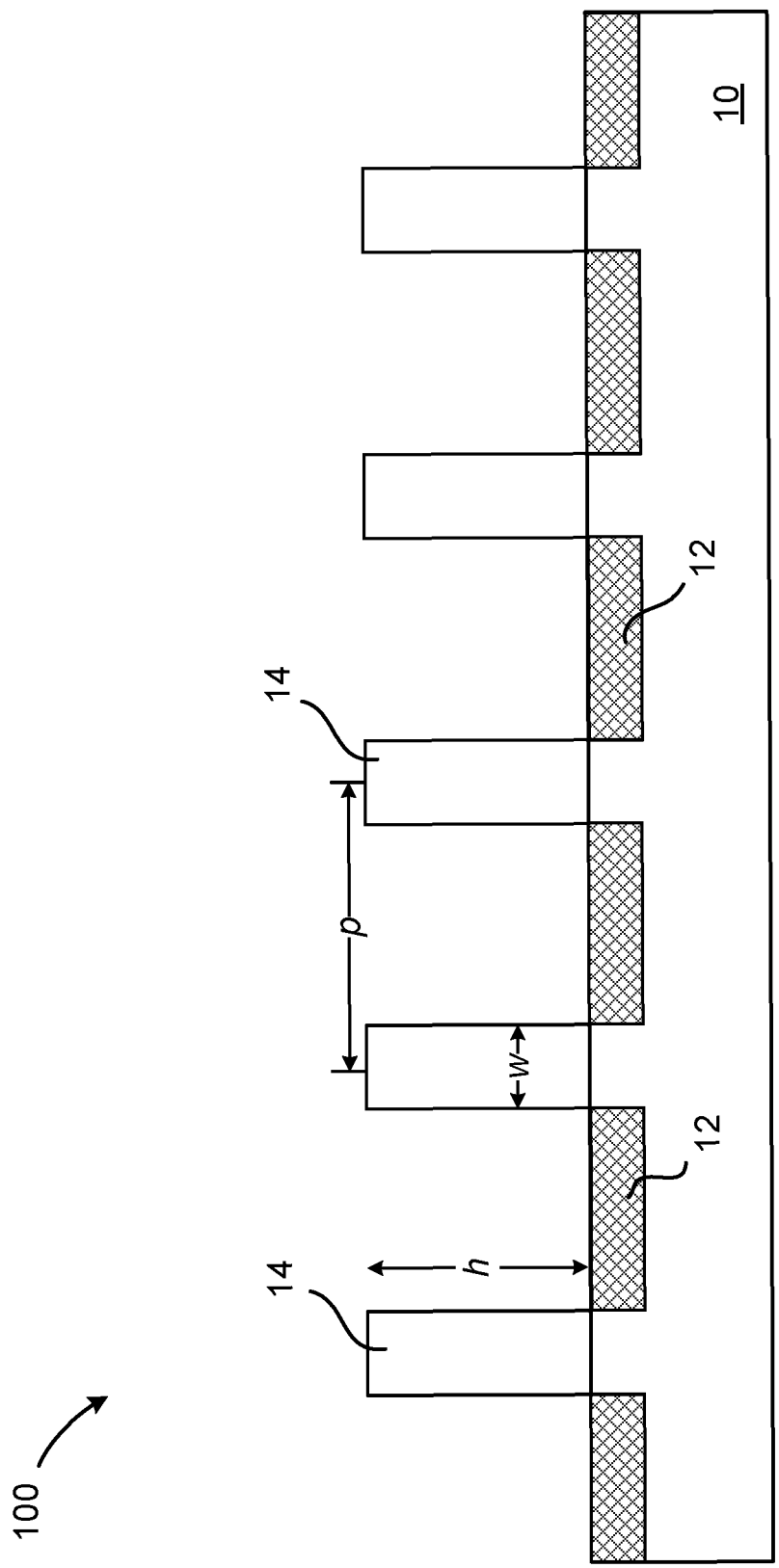
FIG. 1 is a cross-sectional view of a semiconductor structure depicting forming a plurality of fins, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In modern CMOS technologies, epitaxially grown materials may be typically used to form source-drain regions of FET devices since they may provide strain and resistivity benefits. In FinFETs manufacturing, continuous scaling of semiconductor devices may translate in a tighter pitch between adjacent fins. Owing to the tighter pitch between adjacent fins, epitaxial films grown off the fin sidewalls may impose a lateral growth constraint on the source-drain regions of the device, which may negatively affect device spacing and density requirements when maintaining unmerged devices is desired. Additionally, the epitaxial film forming a source-drain region of the FinFET device may extend laterally to contact the epitaxial film forming an adjacent source-drain region, which may result in an unwanted electrical short between two adjacent source-drain regions.

According to embodiments of the present disclosure, by cladding the fins between sidewall spacers, embodiments of the present disclosure may, among other potential benefits, constrain lateral epitaxial growth during formation of source-drain regions thereby reducing the distance between adjacent fins and potentially increasing device density and performance.

The present invention generally relates to semiconductor manufacturing and more particularly to FinFET devices having constrained source-drain epitaxial regions. One way to constrain source-drain epitaxial regions may include forming sidewall spacers on opposing sides of a fin, removing the fin to create a trench between the sidewall spacers and epitaxially growing a new fin within the recess. One embodiment by which to form constrained epitaxial source-drain regions is described in detail below by referring to the accompanying drawings in FIGS. 1-6.

Referring now to FIG. 1, a semiconductor structure 100 may be formed or provided, according to an embodiment of the present disclosure. In the depicted embodiment, the semiconductor structure 100 may include a FinFET device. At this step of the manufacturing process, a plurality of fin structures 14 (hereinafter "fins") may be formed from a substrate 10 of the semiconductor structure 100. In this embodiment, the substrate 10 is a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In the depicted embodiment, the substrate 10 may be made of silicon.

In other embodiments, the substrate 10 may be, for example, a semiconductor-on-insulator (SOI) substrate, where a buried insulator layer separates a base substrate from a top semiconductor layer. The components of the semiconductor structure 100, including the fins 14, may generally be formed in the top semiconductor layer.

The fins 14 may be formed from the substrate 10 using known photolithography and etch processes. In an exemplary embodiment, the fins 14 may be formed using a sidewall image transfer (SIT) technique. In embodiments in which the fins 14 may be formed from a bulk semiconductor substrate, the fins 14 may be isolated from one another by regions of a dielectric material such as, for example, shallow trench isolation (STI) regions 12. It should be noted that, while the embodiment depicted in FIG. 1 includes five fins 14, any number of fins may be formed from the substrate 10. In one exemplary embodiment, the fins 14 may have a height h ranging from approximately 5 nm to approximately 200 nm, a width w ranging from approximately 5 nm to approximately 25 nm and may be separated by a pitch p ranging from approximately 20 nm to approximately 100 nm.

Figure 2:
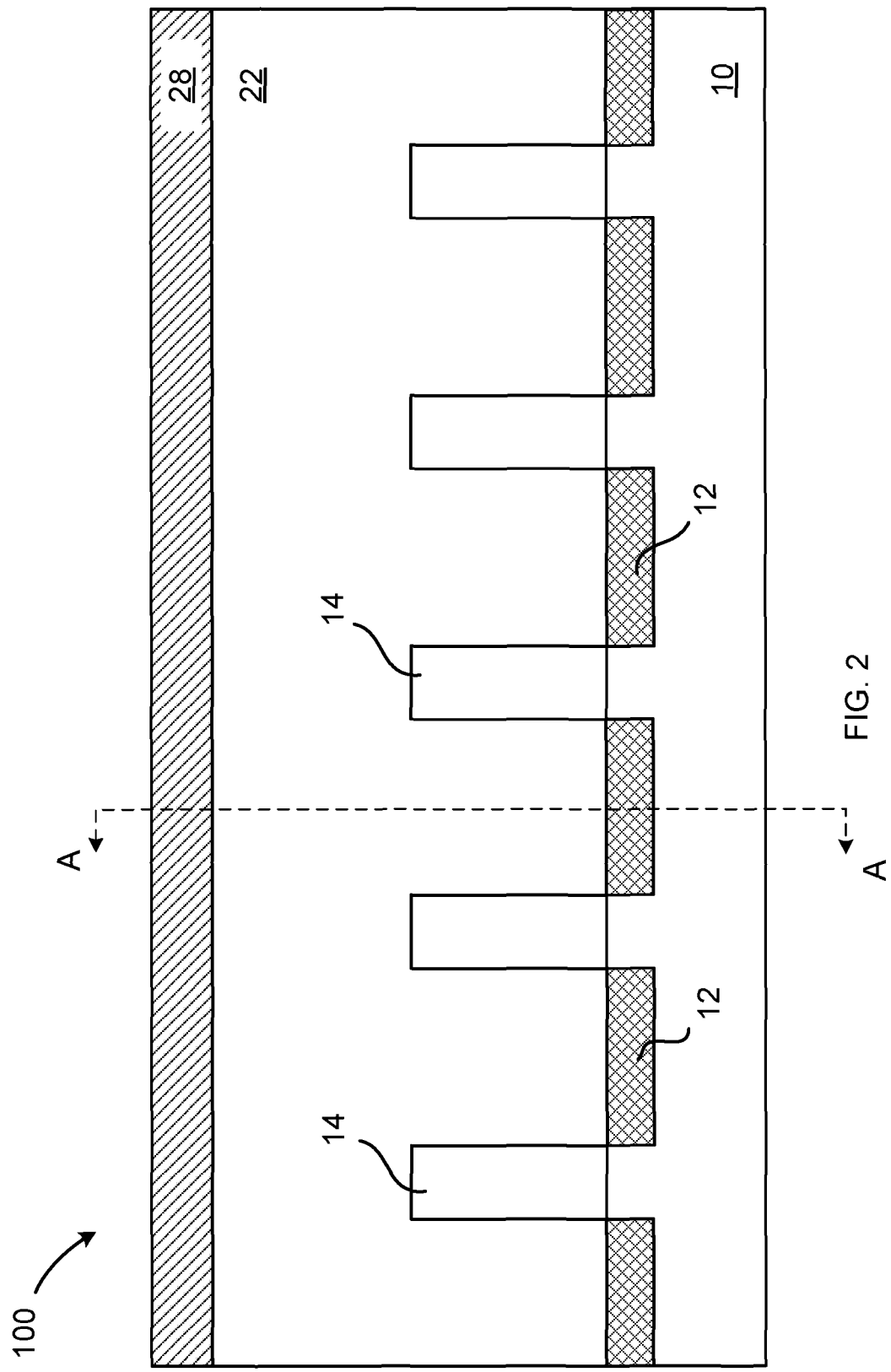
FIG. 2 is a cross-sectional view of the semiconductor structure depicting forming a gate and a gate cap, according to an embodiment of the present disclosure.
Figure 2A:
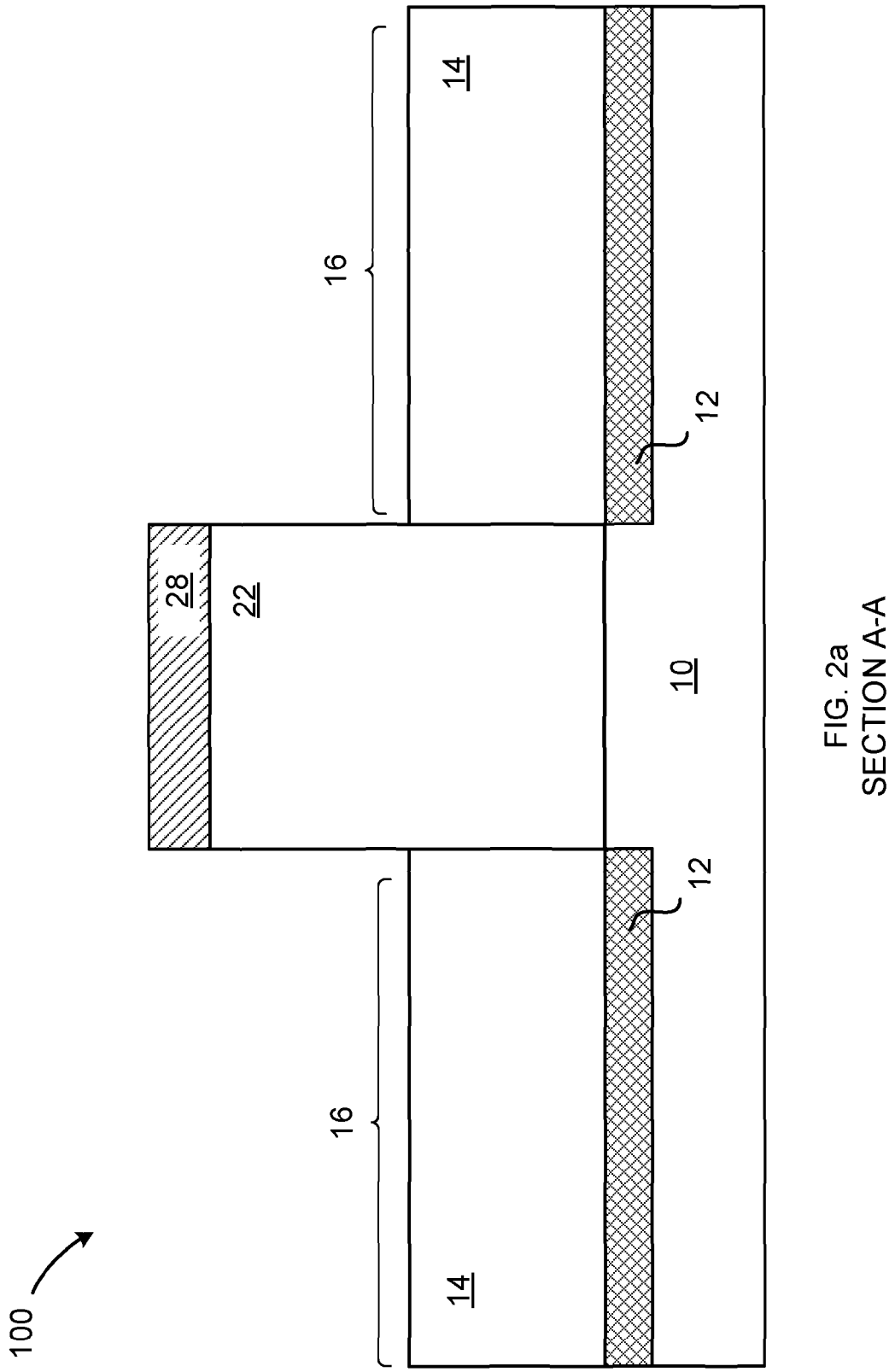
FIG. 2a is a side view of the semiconductor structure, according to FIG. 2.

Referring now to FIGS. 2-2a, a gate electrode 22 (hereinafter referred to as "gate") may be formed over a portion of the fins 14. In this embodiment, FIG. 2a is a side view of FIG. 2 taken along line A-A'. Exposed portions 16 of the fins 14 may consist of regions of the fins 14 not covered by the gate structure 22 as illustrated in FIG. 2a. The portion of the fins 14 covered by the gate 22 may be referred to as a channel region. It should be noted that the semiconductor structure 100 may be fabricated using either a replacement metal gate (RMG) or gate last process flow, or a gate first process flow. For illustration purposes only, without intent of limitation, the embodiment described below uses and details a gate first process flow.

The gate 22 may be generally formed above a gate dielectric (not shown). The gate 22 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination of those materials. In one embodiment, the gate 22 may include tungsten (W). The gate 22 may be deposited by any suitable technique known in the art, for example by chemical vapor deposition (CVD), atomic layer deposition (ALD), physical vapor deposition (PVD), molecular beam deposition (MBD), pulsed laser deposition (PLD), or liquid source misted chemical deposition (LSMCD). The gate dielectric may include any suitable insulating material such as, for example, oxide, nitride, oxynitride or silicate including metal silicates and nitrided metal silicates. In one embodiment, the gate dielectric may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The gate dielectric may be formed by any suitable deposition technique known in the art, including, CVD, plasma-assisted CVD, ALD, evaporation, reactive sputtering, chemical solution deposition or other like deposition processes. The physical thickness of the gate dielectric may vary, but typically may have a thickness ranging from approximately 0.5 nm to approximately 17 nm.

A gate cap 28 may be subsequently formed on top of the gate 22 using any suitable deposition technique known in the art. The gate cap 28 may include, for example, silicon oxide, silicon nitride, silicon oxynitride, boron nitride, or any suitable combination of those materials. In an exemplary embodiment, the gate cap 28 may have a thickness ranging from approximately 30 nm to approximately 200 nm.

Figure 3:
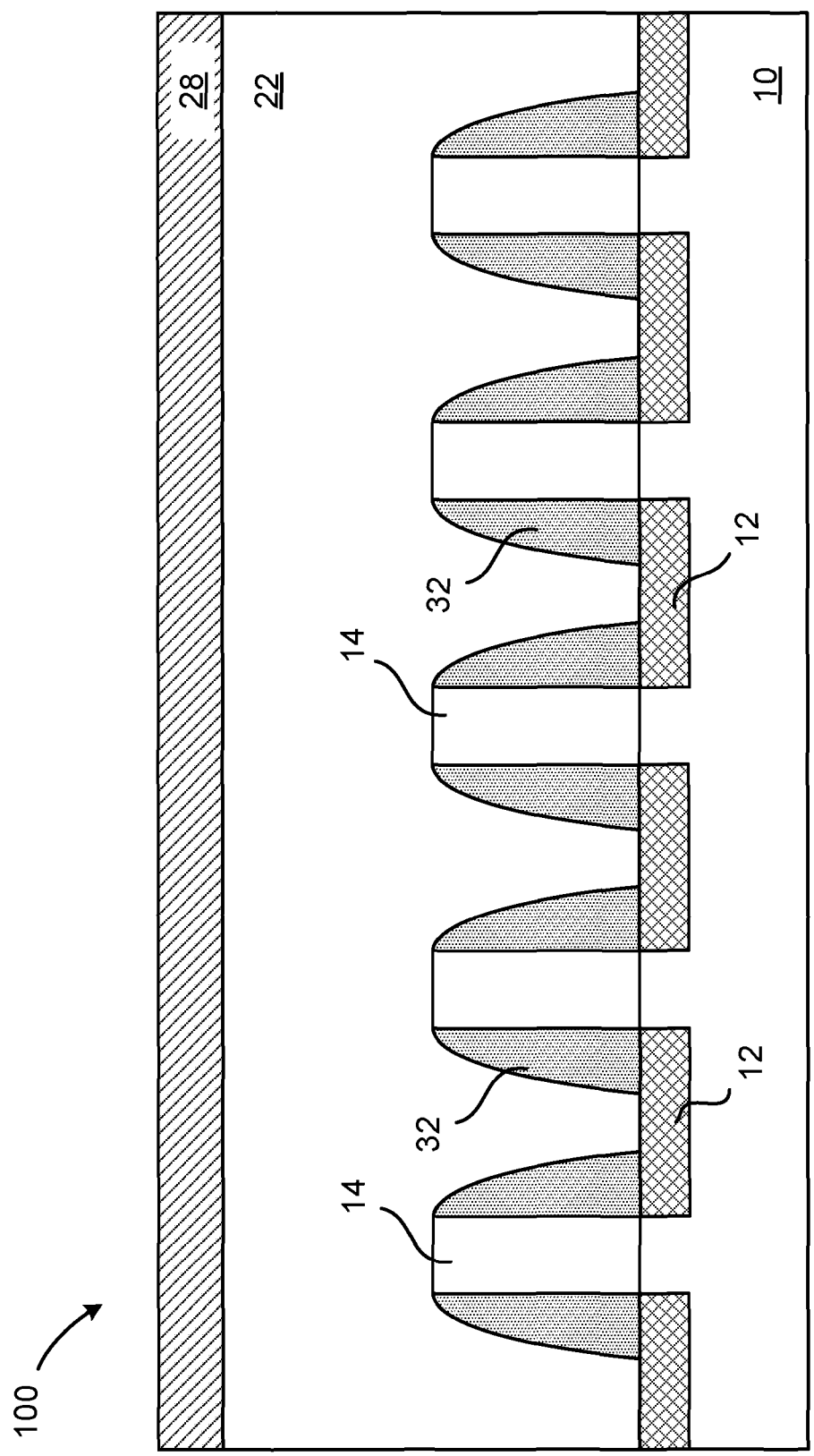
FIG. 3 is a cross-sectional view of the semiconductor structure depicting forming sidewall spacers, according to an embodiment of the present disclosure.

Referring now to FIG. 3, spacers 32 may be formed on opposite sidewalls of the gate 22 and opposite sidewalls of the fins 14. For illustration purposes only, without intent of limitation, only the spacers 32 on opposite sidewalls of the fins 14 are depicted in the drawings.

The spacers 32 may be made from an insulator material such as an oxide, nitride, oxynitride, silicon carbon oxynitride, silicon boron oxynitride, low-k dielectric, or any combination thereof. The spacers 32 may be formed by known deposition and etching techniques. Formation of the spacers 32 may typically include full fin over etch by means of, for example, a reactive ion etching (RIE) technique in order to expose the portion of the fins 14 not covered by the gate 22. In the depicted embodiment, minimal fin over etch is conducted in order to form the spacers 32 on opposite sidewalls of the fins 14. More specifically, the deposited nitride material may be remove from all horizontal surfaces of the semiconductor structure 100 using an anisotropic etch. In various embodiments, the spacers 32 may include one or more layers. It should be understood that while the spacers 32 are herein described in the plural, the spacers 32 may consist of a single spacer surrounding the fins 14.

Due to the etch process performed during formation of the spacers 32, the thickness of the gate cap 28 may be substantially less than in traditional CMOS process flow.

Figure 4:
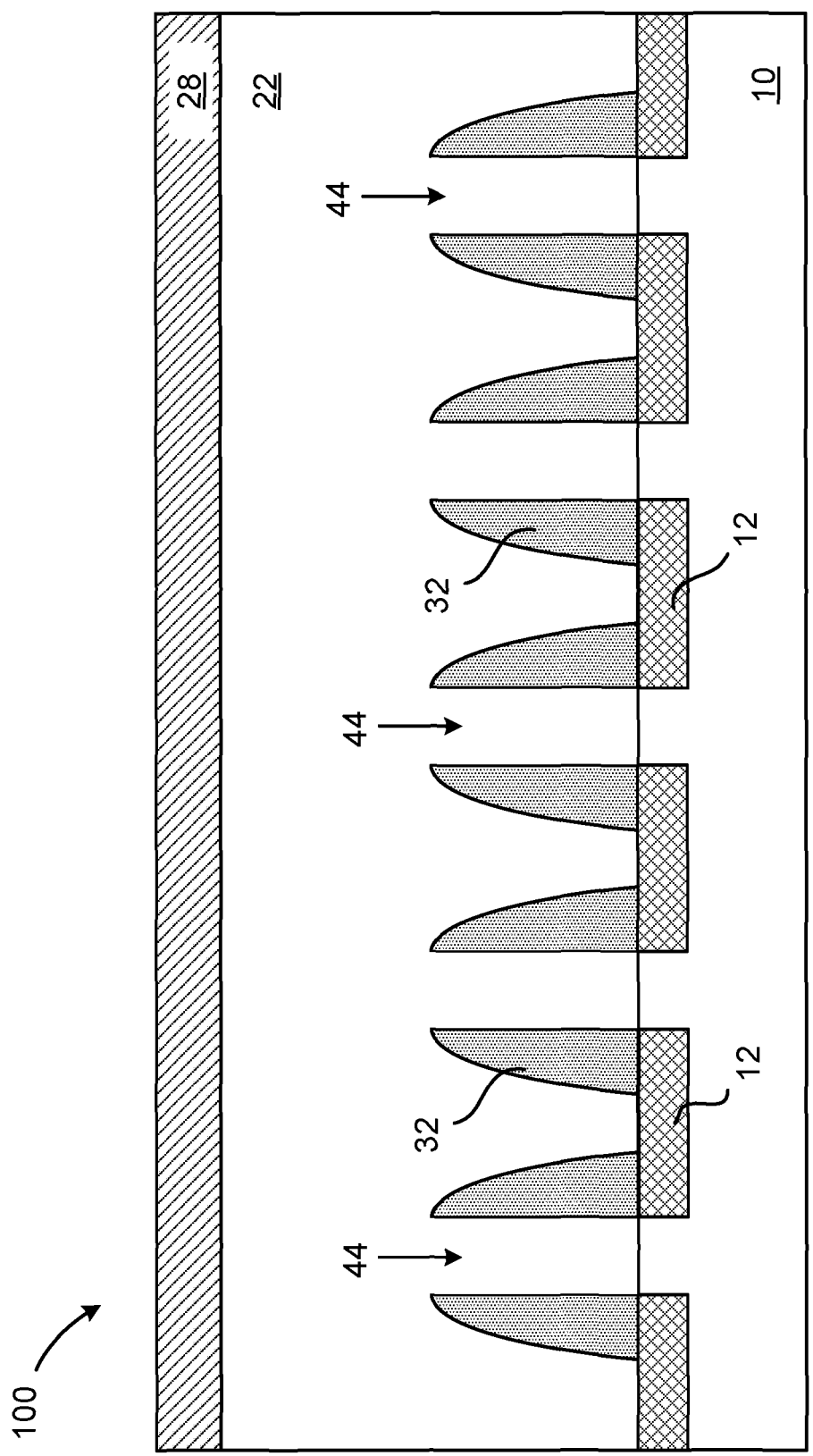
FIG. 4 is a cross-sectional view of the semiconductor structure depicting removing the plurality of fins, according to an embodiment of the present disclosure.
Figure 4A:
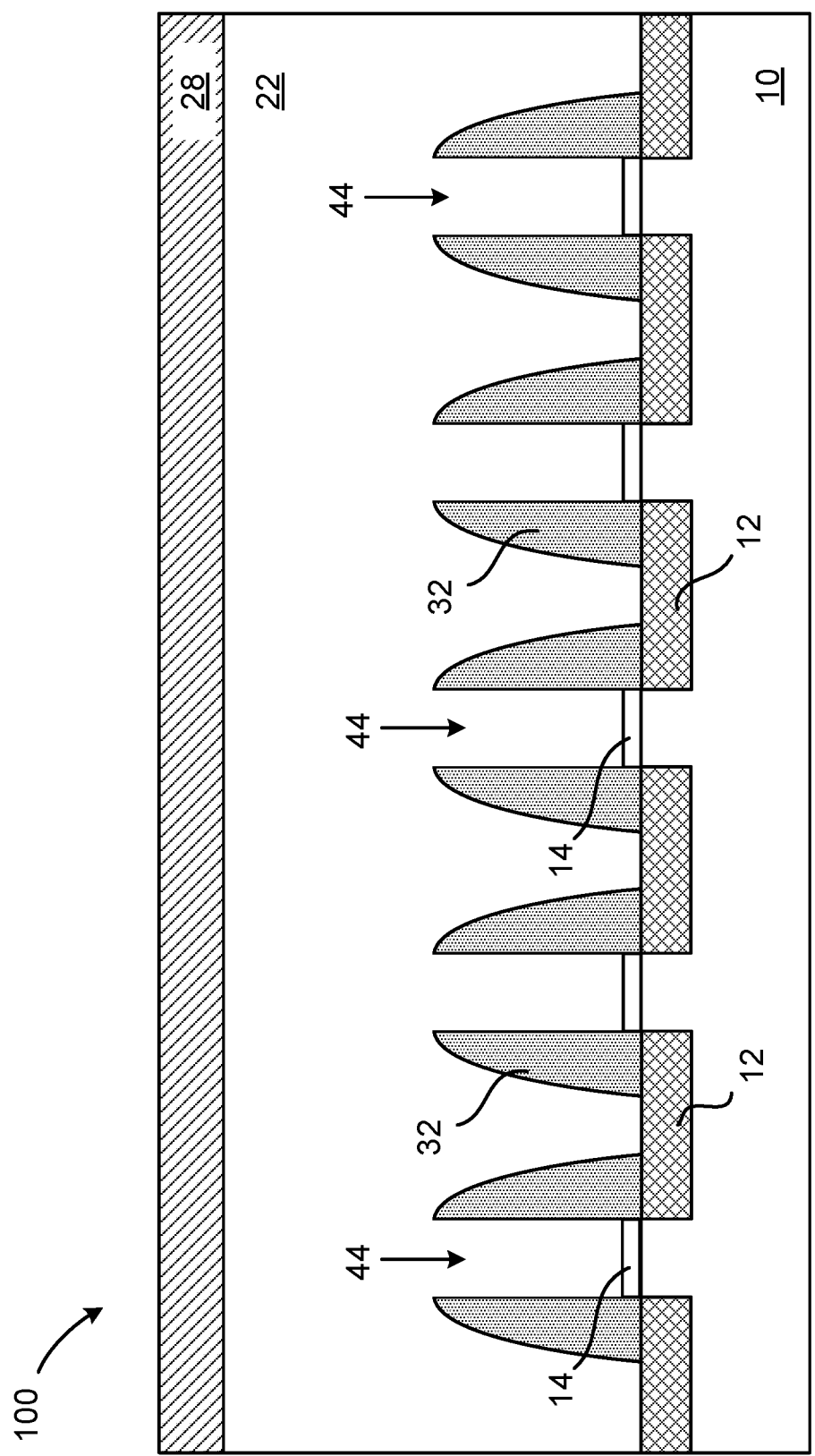
FIG. 4a is a cross-sectional view of the semiconductor structure depicting partially removing the plurality of fins, according to an embodiment of the present disclosure.

Referring now to FIGS. 4-4*a*, the fins 14 (FIG. 3) may be removed from between the spacers 32, according to an embodiment of the present disclosure. The removal of the fins 14 (FIG. 3) may create a trench 44 between the spacers 32. In embodiments in which the substrate 10 is an SOI substrate, the fins 14 (FIG. 3) may be partially removed as illustrated in FIG. 4*a*. More specifically, in embodiments in which the substrate 10 is an SOI substrate, a portion of the fins 14 (FIG. 4*a*) may remain at a bottom of the trench 44 to allow for the subsequent growth of an epitaxial layer.

The fins 14 (FIG. 3) may be selectively removed by means of any etching technique known in the art including, but not limited to, reactive ion etching (RIE) or a wet etch processes. In an embodiment in which the fins 14 (FIG. 3) include silicon and the spacers 32 include a nitride, a fluorine based RIE may be conducted to remove the fins 14 (FIG. 3). It should be noted that a portion of the fins 14 that is covered by the gate 22, otherwise referred to as the channel region, remains after selectively removing the fins 14 from between the spacers 32.

Figure 5:
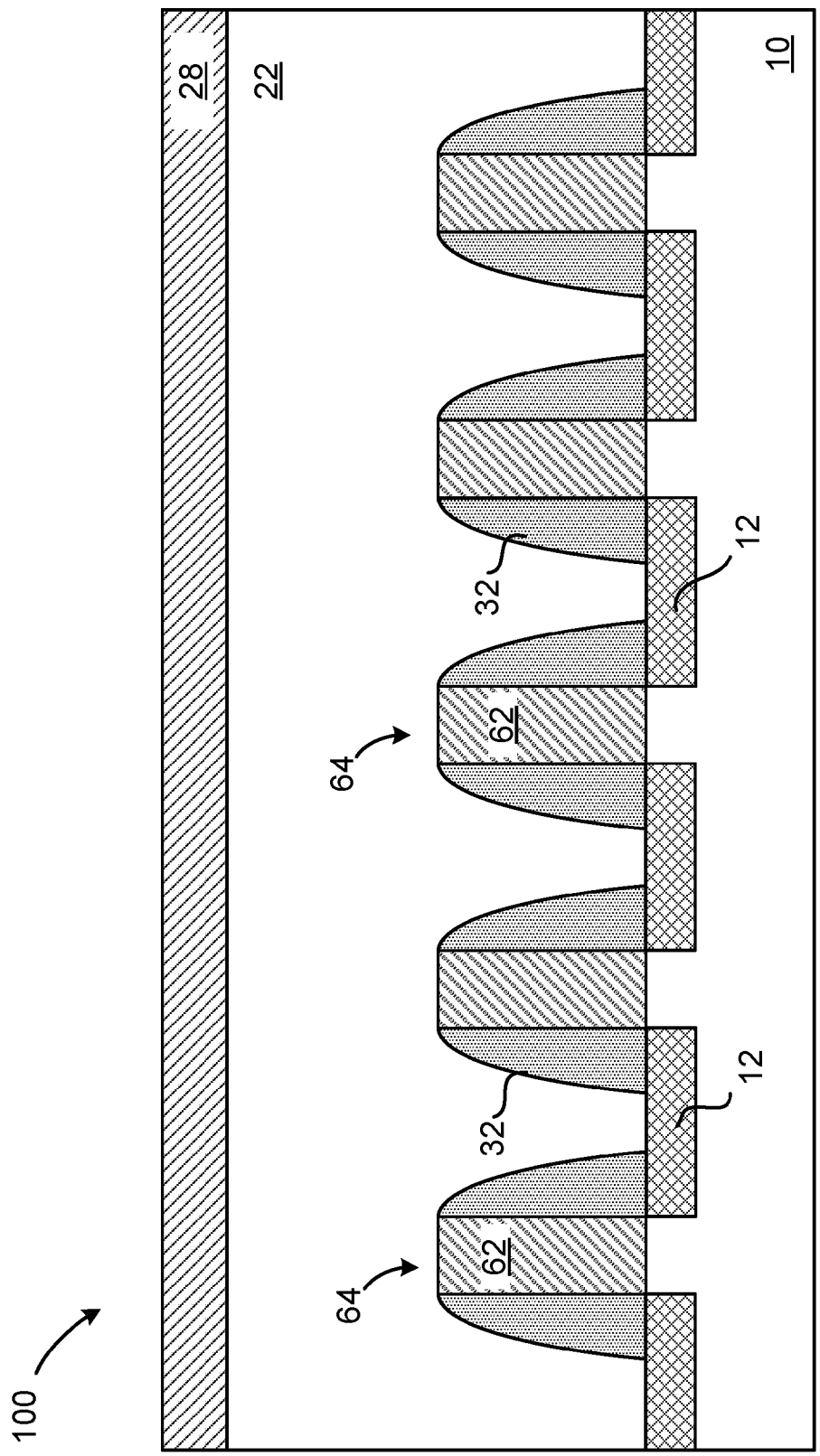
FIG. 5 is a cross-sectional view of the semiconductor structure, depicting growing an epitaxial layer, according to an embodiment of the present disclosure.

Referring now to FIG. 5, an epitaxial layer 62 may be grown in the trench 44 (FIG. 4), according to an embodiment of the present disclosure. The epitaxial layer 62 may replace the fins 14 (FIG. 3). The trench 44 (FIG. 4) between the spacers 32 may provide a template to re-grow the fins in the semiconductor structure 100 in a way such that lateral epitaxial growth may not occur during the process of forming the epitaxial layer 62, and therefore producing laterally constrained source-drain regions 64. The epitaxial layer 62 may be grown directly from the substrate 10 exposed at the bottom of the trench 44 (FIG. 4). In embodiments in which the substrate 10 is an SOI substrate, the epitaxial layer 62 may be grown directly from the portion of the fins 14 (FIG. 4*a*) remaining at the bottom of the trench 44 (FIG. 4*a*). In such embodiments, the portion of the fins 14 remaining at the bottom of the trench 44 (FIG. 4*a*) may serve as a seed layer for growing the epitaxial layer 62.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

The epitaxial layer 62 may include any suitable semiconductor material having a dopant concentration according to the characteristics of the semiconductor structure 100.

For example, in one embodiment where the semiconductor structure 100 is an n-type field effect transistor (n-FET) device, the epitaxial layer 62 may include a carbon-doped silicon (Si:C) material, where the atomic concentration of carbon (C) may range from approximately 0.2% to approximately 3.0%. The epitaxial layer 62 may be doped by any known n-type dopant use in the fabrication of n-FET devices such as, for instance, phosphorus or arsenic. In one embodiment, the dopant concentration in the epitaxial layer 62 may range from approximately $5 \times 10^{19}$ $cm^{-3}$ to approximately $2 \times 10^{21}$ $cm^{-3}$.

For example, in another embodiment where the semiconductor structure 100 is a p-type field effect transistor (p-FET) device, the epitaxial layer 62 may include a silicon germanium (SiGe) material, where the atomic concentration of germanium (Ge) may range from approximately 10% to approximately 80%. The epitaxial layer 62 may be doped by any known p-type dopant use in the fabrication of p-FET devices such as, for instance, boron. In one embodiment, the dopant concentration in the epitaxial layer 62 may range from approximately $5\times10^{19}$ cm$^{-3}$ to approximately $2\times10^{21}$ cm$^{-3}$.

Examples of various epitaxial growth process apparatuses that may be suitable for use in forming the epitaxial layer 62 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

Figure 6:
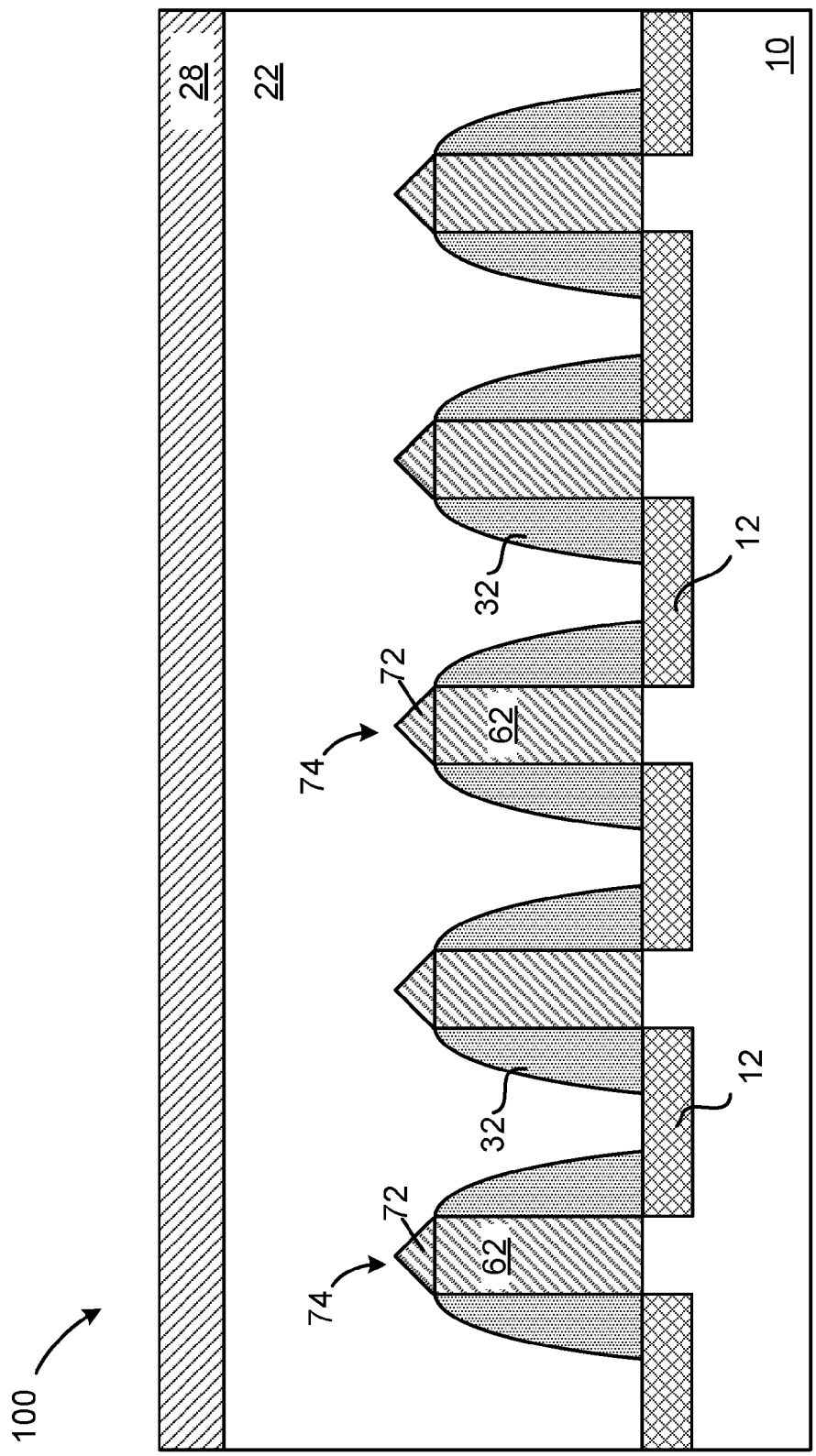
FIG. 6 is a cross-sectional view of the semiconductor structure, depicting forming an extended epitaxial region, according to an embodiment of the present disclosure.

Referring now to FIG. 6, alternatively, growth of the epitaxial layer 62 may continue until an extended epitaxial region 72 may be formed in an area above the epitaxial layer 62 outside the spacers 32. Epitaxial growth in the extended epitaxial region 72 may generally take place on a {111} plane. The triangular shape observed in the extended epitaxial region 72 may be a consequence of the different growth rates during the epitaxial deposition process inherent to each crystallographic orientation plane of the material forming the epitaxial layer 62. In other embodiments, the extended epitaxial region 72 may have a shape other than the triangular shape depicted in FIG. 6. In this embodiment, the extended epitaxial region 72 and the epitaxial layer 62 may form extended constrained source-drain regions 74.

The source-drain regions 64 (FIGS. 5-6) may be geometrically constrained by the spacers 32 such that lateral epitaxial growth, particularly in the {111} plane, may be prevented. This may allow for optimal fin spacing and device density, reducing the amount of layout constraints in the semiconductor structure 100 that may be dictated by the size of the lateral epitaxial growth. Also, by preventing lateral growth during formation of the source-drain regions the risk of contacting another electrical component and cause an electrical short in the device may be reduced.

Another embodiment by which to form constrained source-drain regions is described in detail below by referring to the accompanying drawing in FIGS. 7-14. The present embodiment may include forming an etch stop liner above the fins prior to forming the constrained source-drain regions.

Figure 7:
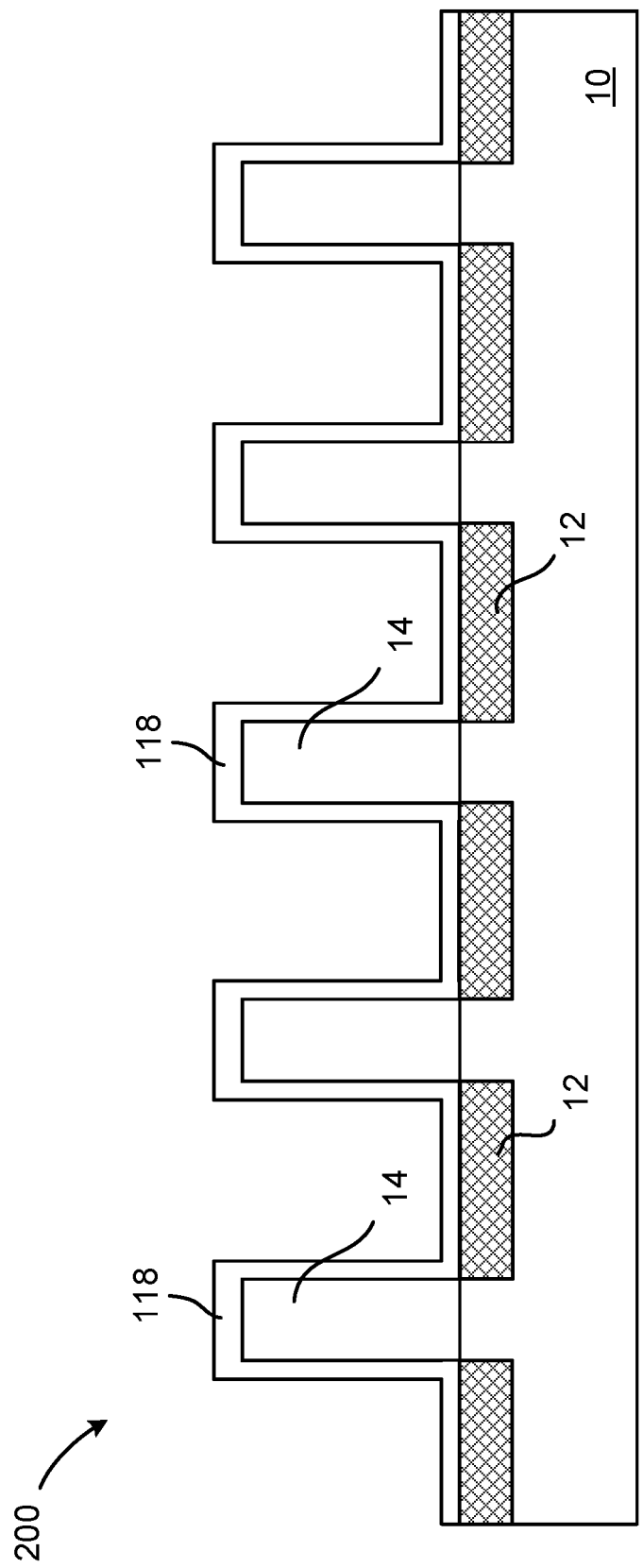
FIG. 7 is a cross-sectional view of the semiconductor structure, depicting depositing a nitride liner over the plurality of fins, according to another embodiment of the present disclosure.

Referring now to FIG. 7, a nitride liner 118 may be conformally deposited above the fins 14, according to another embodiment of the present disclosure. The nitride liner 118 may function as an etch-stop liner to protect areas of the substrate 10 located between the fins 14 during subsequent etching steps. In the depicted embodiment, the substrate 10 includes a bulk silicon substrate in which the nitride liner 118 may also protect STI regions 12 during successive etching steps. In general, the nitride liner 118 may prevent excessive over etch of areas of the substrate 10 located between the fins 14. The nitride liner 118 may be formed by any deposition method known in the art such as, for example, CVD or ALD of a nitride material. The thickness of the nitride liner 118 may vary from approximately 5 nm to approximately 25 nm.

Figure 8:
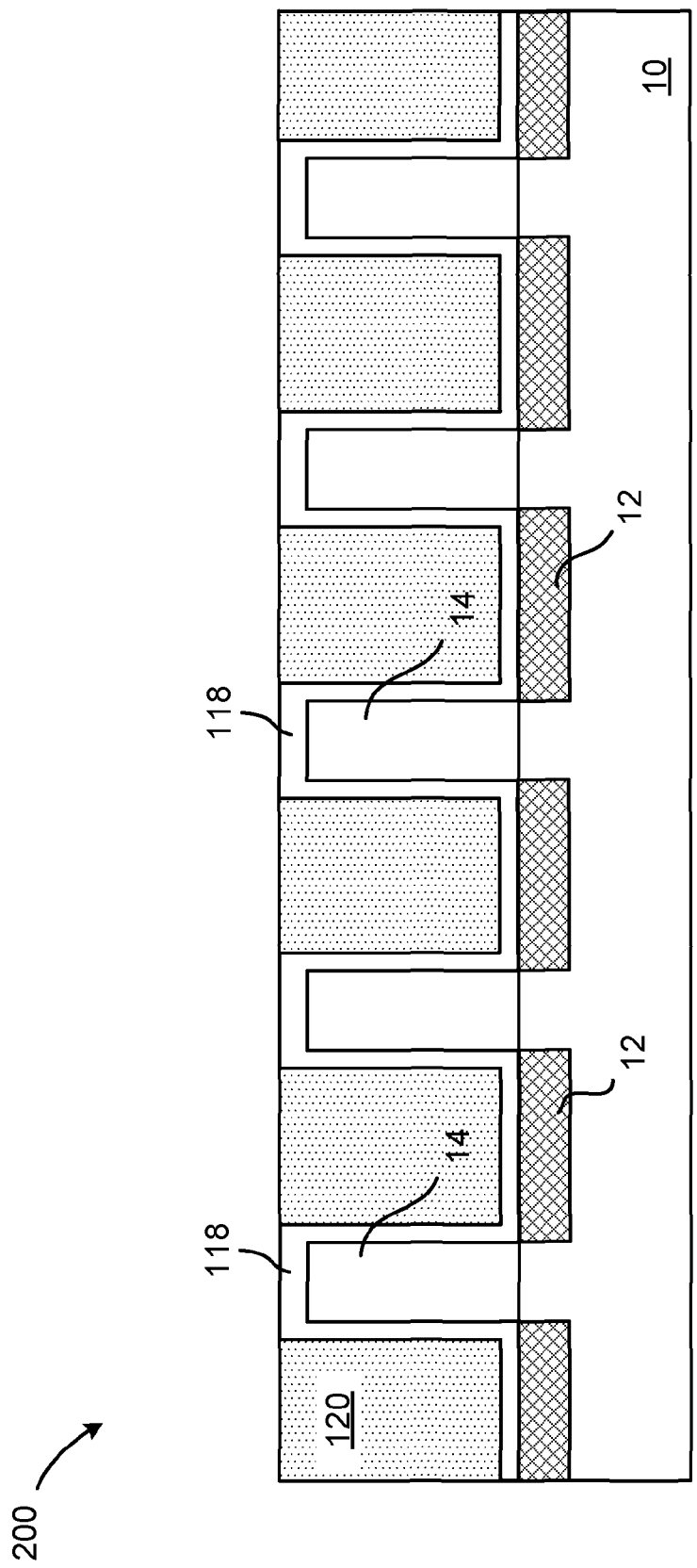
FIG. 8 is a cross-sectional view of the semiconductor structure, depicting depositing a dielectric layer, according to another embodiment of the present disclosure.

Referring now to FIG. 8, a dielectric layer 120 may be deposited on the semiconductor structure 200. The dielectric layer 120 may include any suitable dielectric material, for example, silicon oxide, hydrogenated silicon carbon oxide, silicon based low-k dielectrics, flowable oxides, porous dielectrics, or organic dielectrics including porous organic dielectrics and may be formed by any suitable deposition method known in the art, for example, by CVD of the dielectric material.

The dielectric layer 120 may be planarized until a top portion of the nitride liner 118 positioned above the fins 14 is exposed. A chemical mechanic polishing (CMP) may be conducted until the dielectric layer 120 may be substantially coplanar with the top portion of the nitride liner 118. Stated differently the CMP technique may be conducted until a top surface of the dielectric layer 120 is substantially flush with a top surface of the exposed portion of the nitride liner 118. The dielectric layer 120 may remain above the substrate 10 and between the fins 14 in order to protect these areas during subsequent etching steps.

Figure 9:
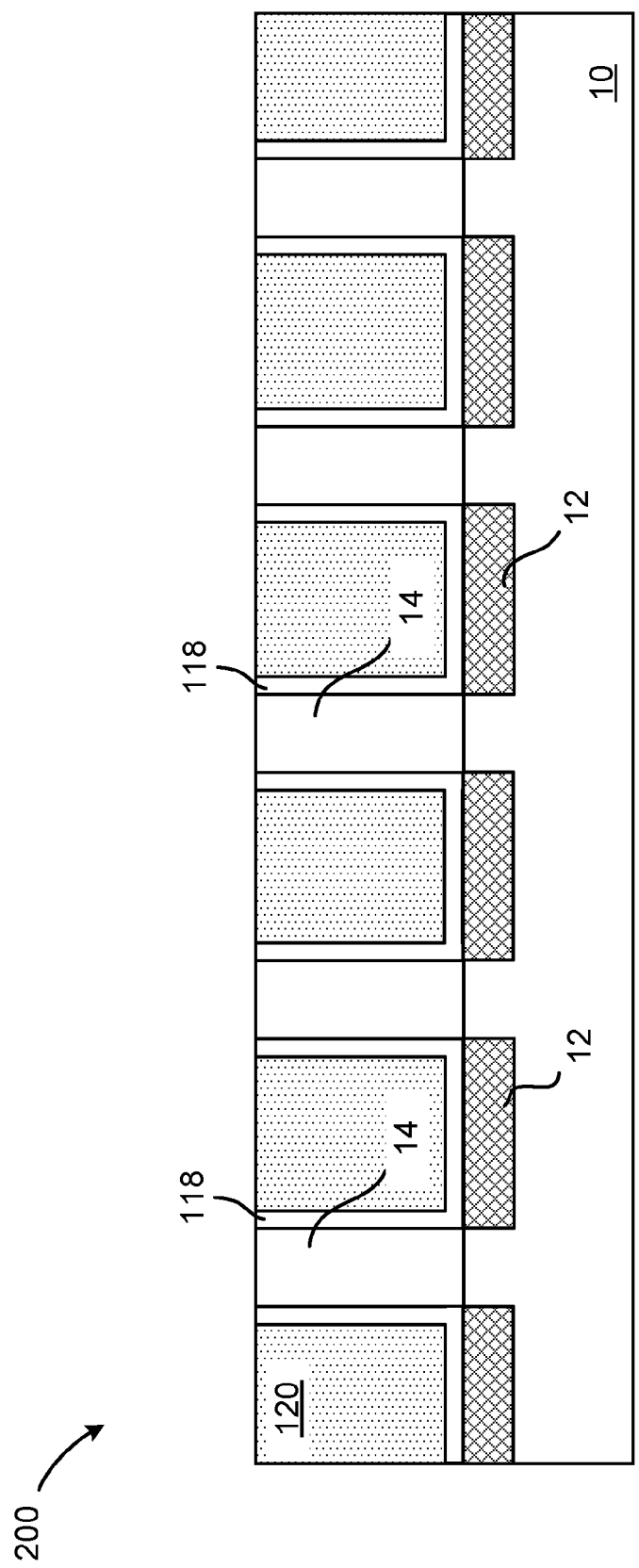
FIG. 9 is a cross-sectional view of the semiconductor structure, depicting removing the nitride cap, according to another embodiment of the present disclosure.

Referring now to FIG. 9, a top portion of the nitride liner 118 (FIG. 9) may be removed to expose a top surface of the fins 14. The top portion of the nitride liner 118 (FIG. 9) may be removed by means of an anisotropic etching technique in which the etch rate in the direction normal to the surface to be etched may be greater than in the direction parallel to the surface to be etched. The anisotropic etching technique may include a reactive-ion etching (RIE).

After exposing the top surface of the fins 14, the dielectric layer 120 may be removed by means of any etching technique known in the art.

Figure 10:
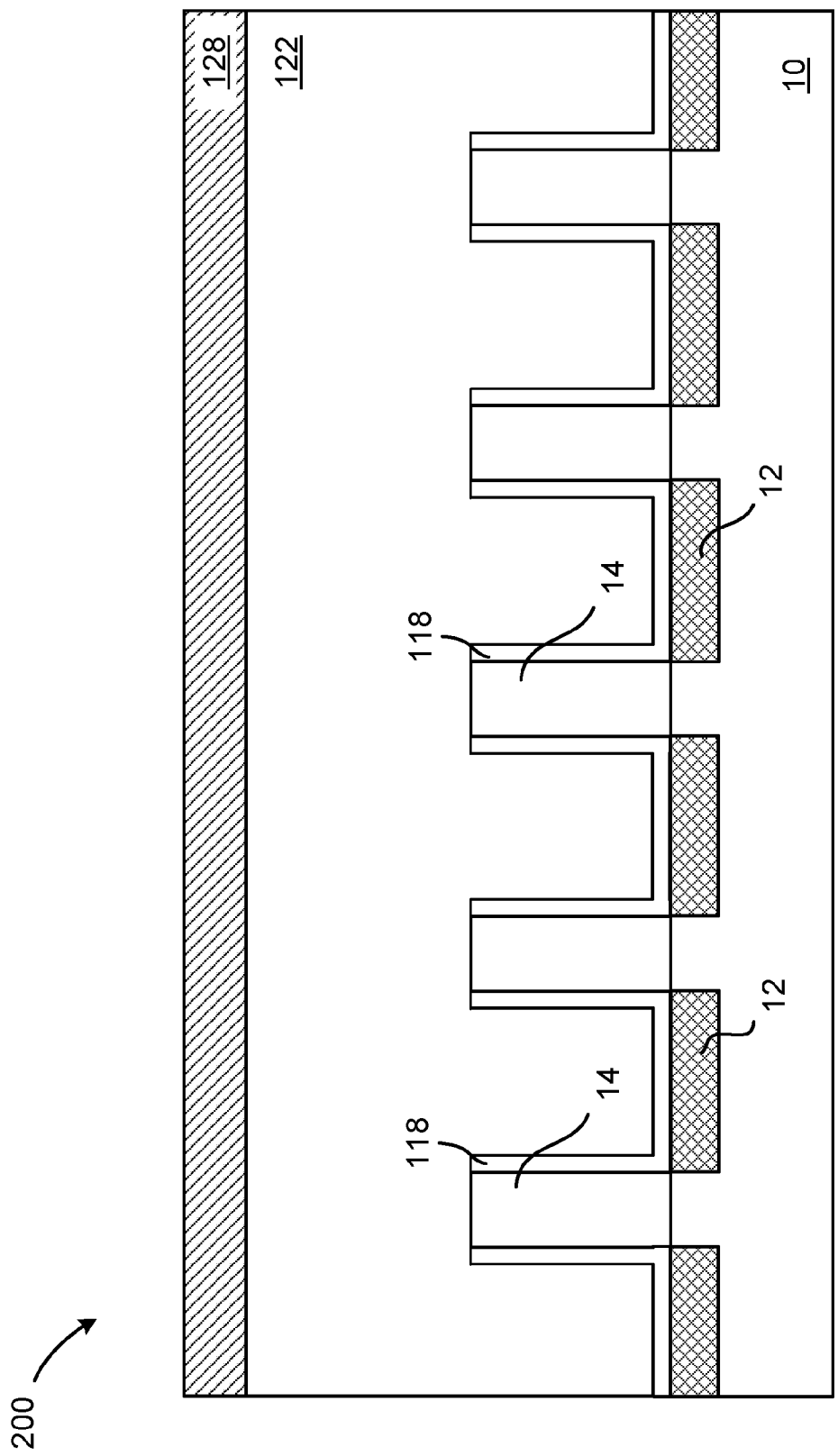
FIG. 10 is a cross-sectional view of the semiconductor structure, depicting forming a gate and a gate cap, according to another embodiment of the present disclosure.

Referring now to FIG. 10, a gate 122 and a gate cap 128 may be formed following the processing steps previously described in FIG. 2. It should be noted that the formation of the nitride liner 118 prior to forming the gate 122 may limit this alternate embodiment to a gate last or replacement metal gate (RMG) process flow. Therefore, the embodiment described below uses a gate last process flow.

In a gate last process flow, the gate 122 may include a dummy gate which may be pattered and etched from a polysilicon layer. A pair of device spacers can be disposed on opposite sidewalls of the dummy gate. The dummy gate and the pair of device spacers may then be surrounded by an interlevel dielectric. Later, the dummy gate may be removed from between the pair of device spacers, as by, for example, an anisotropic vertical etch process such as RIE. This creates an opening between the pair of device spacers where a metal gate may then be formed between the pair of device spacers. Optionally, a gate dielectric may be configured below the metal gate.

Figure 11:
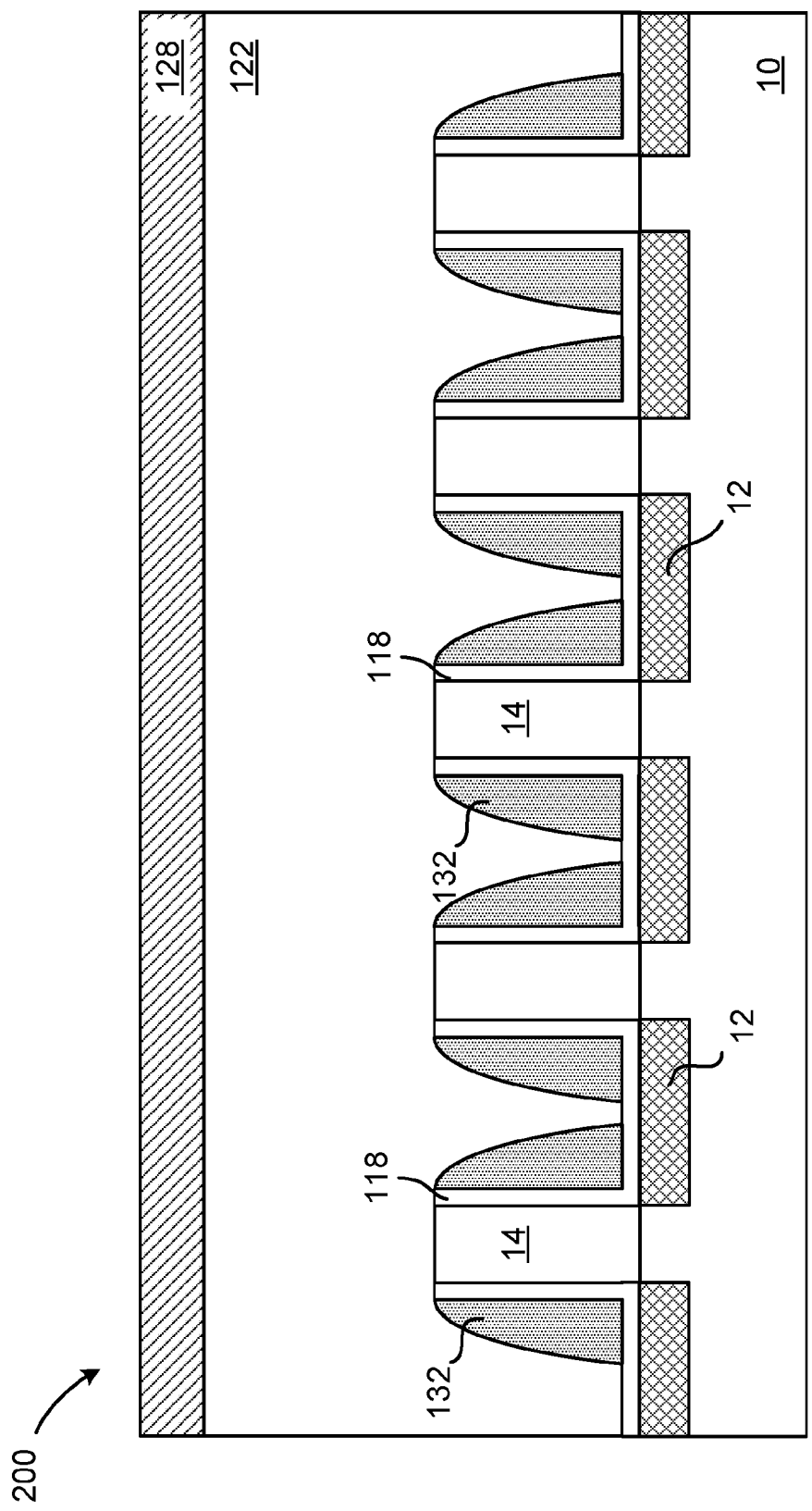
FIG. 11 is a cross-sectional view of the semiconductor structure, depicting forming sidewall spacers, according to another embodiment of the present disclosure.

Referring now to FIG. 11, spacers 132 may be formed on opposite sides of the nitride liner 118. The formation of the spacers 132 may follow the steps described above with reference to FIG. 3. In this embodiment, the spacers 132 may be adjacent to the nitride liner 118. For illustration purposes only, without intent of limitation, only the spacers 132 on opposite sidewalls of the nitride liner 118 are depicted in the drawings.

Figure 12:
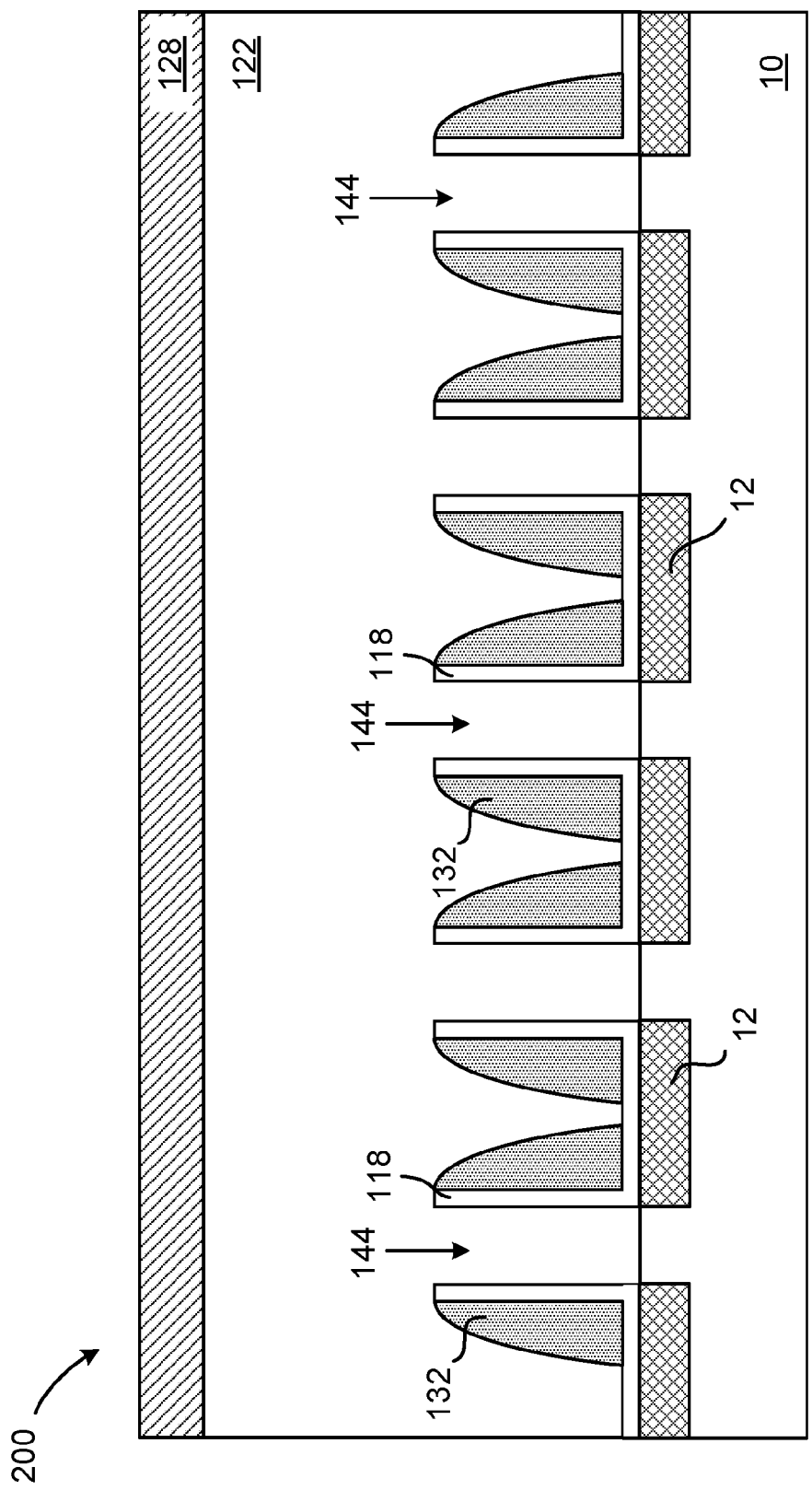
FIG. 12 is a cross-sectional view of the semiconductor structure, depicting removing the plurality of fins, according to another embodiment of the present disclosure.
Figure 12A:
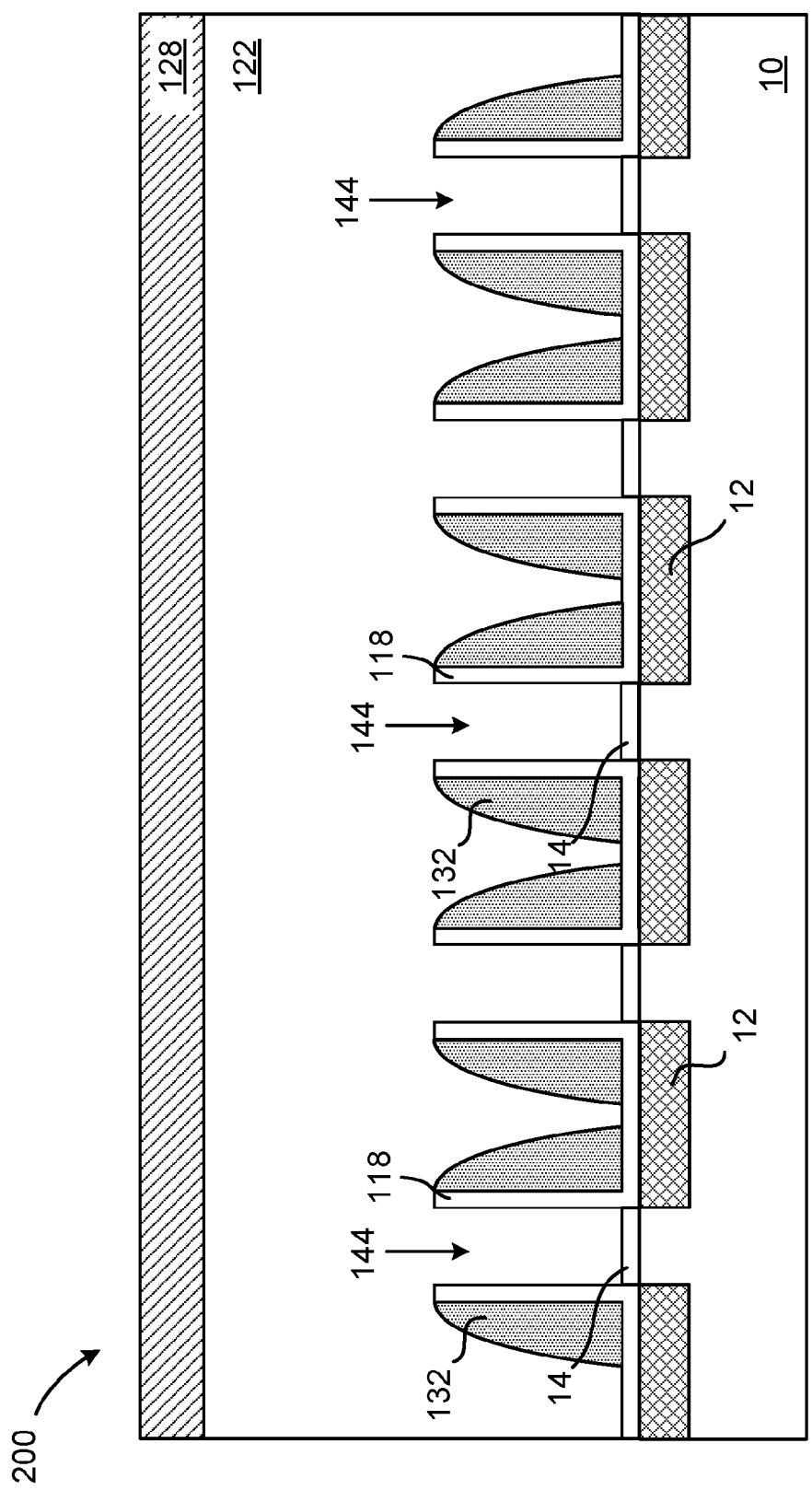
FIG. 12a is a cross-sectional view of the semiconductor structure, depicting partially removing the plurality of fins, according to another embodiment of the present disclosure.

Referring now to FIGS. 12-12a, the fins 14 may be removed following the processing steps previously described in FIGS. 4-4a. In this embodiment, the removal of the fins 14 may create a trench 144 between opposing sidewalls of the nitride liner 118.

Figure 13:
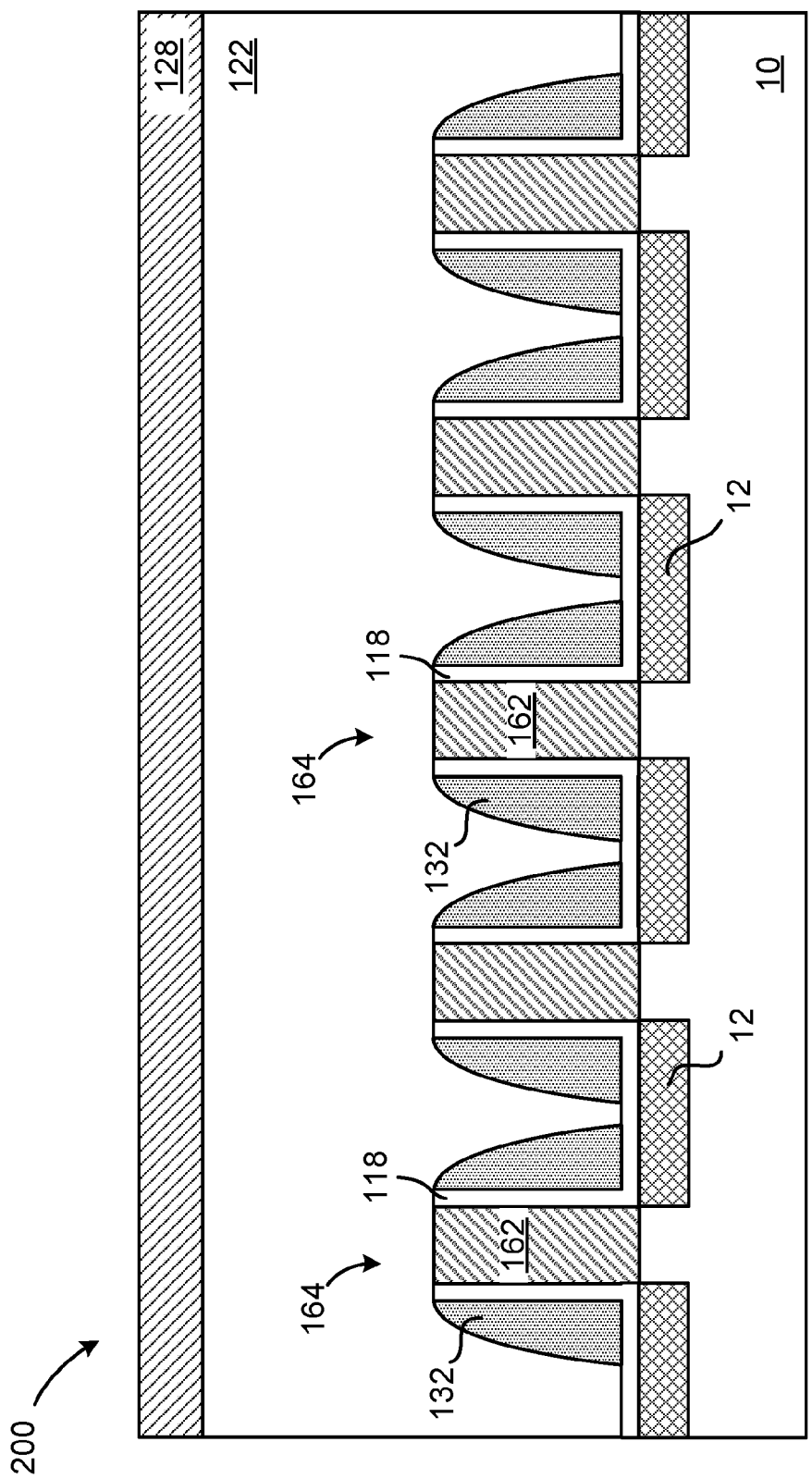
FIG. 13 is a cross-sectional view of the semiconductor structure, depicting forming an epitaxial layer, according to another embodiment of the present disclosure.

Referring now to FIG. 13, an epitaxial layer 162 may be formed in the trench 144 (FIG. 13). The epitaxial layer 162 may replace the fins 14 (FIG. 12). The trench 144 (FIG. 13) between the opposing sidewalls of the nitride liner 118 may provide a template to re-grow fins in the semiconductor structure 200 in a way such that lateral epitaxial growth may not occur during formation of the epitaxial layer 162, and therefore producing laterally constrained source-drain regions 164. The epitaxial layer 162 may be grown directly from the substrate 10 exposed at the bottom of the trench 144 (FIG. 13). In embodiments in which the substrate 10 is an SOI substrate, the epitaxial layer 162 may be grown directly from a portion of the fins 14 (FIG. 12a) remaining at the bottom of the trench 144 (FIG. 12a). In such embodiments, the portion of the fins 14 remaining at the bottom of the trench 144 (FIG. 12a) may serve as a seed layer for growing the epitaxial layer 162.

The epitaxial layer 162 may include any suitable semiconductor material having a dopant concentration according to the characteristics of the semiconductor structure 200.

For example, in one embodiment where the semiconductor structure 200 is an n-type field effect transistor (n-FET) device, the epitaxial layer 162 may include a carbon-doped silicon (Si:C) material, where the atomic concentration of carbon (C) may range from approximately 0.2% to approximately 3.0%. The epitaxial layer 162 may be doped by any known n-type dopant use in the fabrication of n-FET devices such as, for instance, phosphorus or arsenic. In one embodiment, the dopant concentration in the epitaxial layer 162 may range from approximately $5\times10^{19}$ cm$^{-3}$ to approximately $2\times10^{21}$ cm$^{-3}$.

For example, in another embodiment where the semiconductor structure 200 is a p-type field effect transistor (p-FET) device, the epitaxial layer 162 may include a silicon germanium (SiGe) material, where the atomic concentration of germanium (Ge) may range from approximately 10% to approximately 80%. The epitaxial layer 162 may be doped by any known p-type dopant use in the fabrication of p-FET devices such as, for instance, boron. In one embodiment, the dopant concentration in the epitaxial layer 162 may range from approximately $5\times10^{19}$ cm$^{-3}$ to approximately $2\times10^{21}$ cm$^{-3}$.

Examples of various epitaxial growth process apparatuses that may be suitable for use in forming the epitaxial layer 162 may include, for example, RTCVD, LEPD, UHVCVD, APCVD and MBE.

Figure 14:
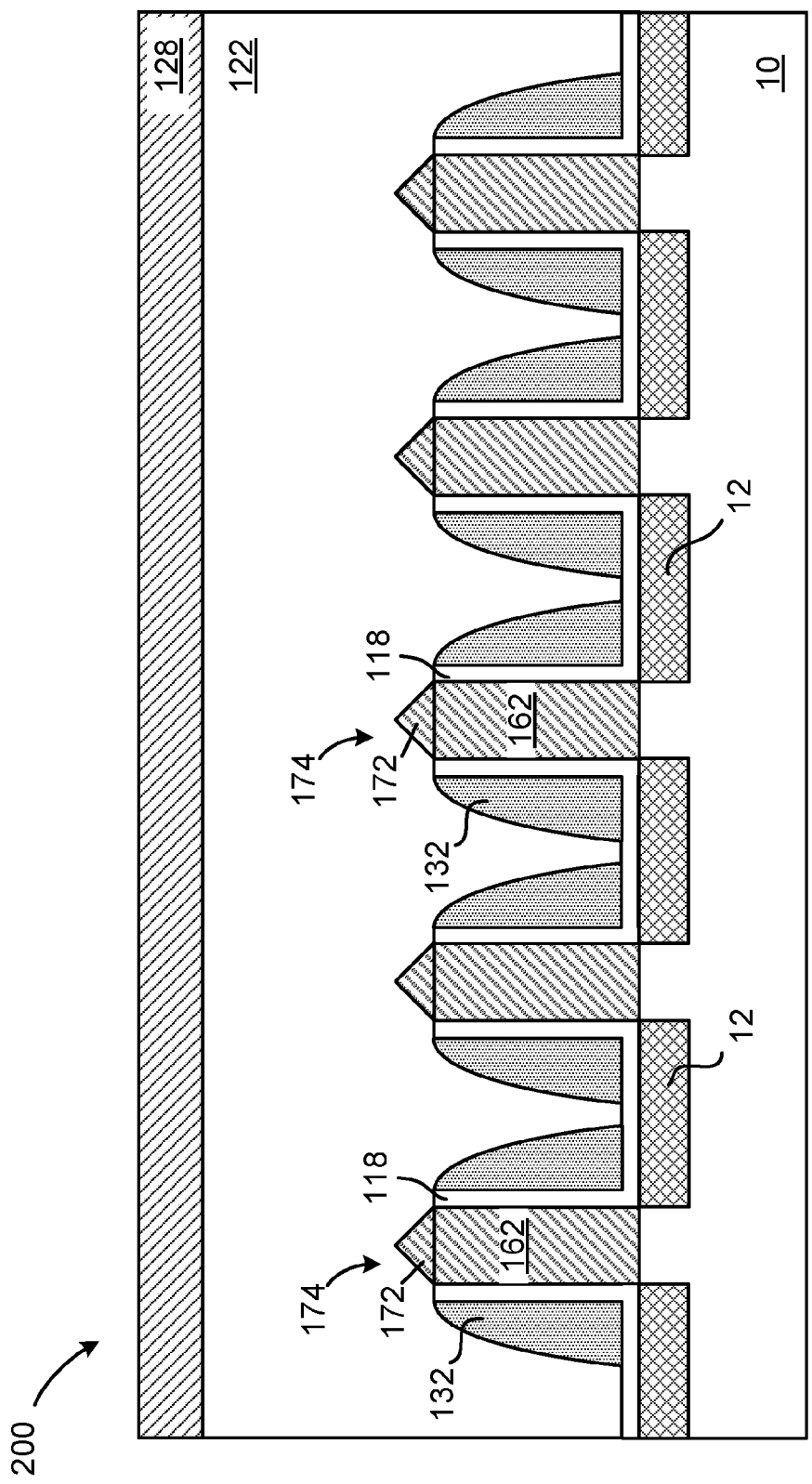
FIG. 14 is a cross-sectional view of the semiconductor structure, depicting forming an extended epitaxial region, according to another embodiment of the present disclosure.

Referring now to FIG. 14, alternatively, epitaxial growth may continue until an extended epitaxial region 172 may be formed above the epitaxial layer 162. Epitaxial growth in the extended epitaxial region 172 may generally take place on a {111} plane. The triangular shape observed in the extended epitaxial region 172 may be a consequence of the different growth rates during the epitaxial deposition process inherent to each crystallographic orientation plane of the material forming the epitaxial layer 162. In other embodiments, the extended epitaxial region 172 may have a shape other than the triangular shape depicted in FIG. 14. In this embodiment, the extended epitaxial region 172 and the epitaxial layer 162 may form extended constrained source-drain regions 174.

The source-drain regions 164 (FIGS. 13-14) may be geometrically constrained by the nitride liner 118 such that lateral epitaxial growth, particularly in the {111} plane, may be prevented. This may allow for optimal fin spacing and device density, reducing the amount of layout constraints in the semiconductor structure 200 that may be dictated by the size of the lateral epitaxial growth. Also, by preventing lateral growth during formation of the source-drain regions the risk of contacting another electrical component and cause an electrical short in the device may be reduced.

Therefore, by cladding or confining the fins between sidewalls spacers or a nitride liner, epitaxial source-drain regions may be formed with constrained lateral epitaxial growth. As a result, fin-to-fin proximity may be reduced and device density may be enhanced while decreasing the risk of contacting another electrical component and cause an unwanted electrical short in the device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a plurality of fins on a substrate;
   a gate over a first portion of the plurality of fins, a second portion of the plurality of fins is exposed; and
   a nitride material above and in direct contact with the gate and on opposite sides of the second portion of the plurality of fins such that a top region of the second portion of the plurality of fins remains exposed, the nitride material on opposite sides of the second portion of the plurality of fins comprises sidewall spacers,
   wherein the second portion of the plurality of fins comprises:
      an epitaxially grown semiconductor material, wherein lateral growth of the epitaxially grown semiconductor material is prevented by the sidewall spacers, the epitaxially grown semiconductor material comprises geometrically constrained unmerged source-drain regions,
      wherein a top portion of the epitaxially grown semiconductor material extends upwardly from the sidewall spacers,
      wherein epitaxial growth of the top portion of the epitaxially grown semiconductor material takes place on a {1 1 1} plane, and
      wherein a width of the top portion of the epitaxially grown semiconductor material is equal to or less than a width of the geometrically constrained unmerged source-drain regions.

2. The structure of claim 1, wherein the top portion of the epitaxially grown semiconductor material extending upwardly from the sidewall spacers comprises a triangular shape.

3. The structure of claim 1, wherein the epitaxially grown semiconductor material comprises in-situ doped silicon.

4. The structure of claim 1, wherein the epitaxially grown semiconductor material comprises in-situ doped silicon-germanium.

5. The structure of claim 1, wherein the substrate comprises a bulk semiconductor substrate or a semiconductor-on-insulator (SOI) substrate.

* * * * *